(12) United States Patent
Elfadel

(10) Patent No.: US 7,979,246 B2
(45) Date of Patent: *Jul. 12, 2011

(54) SYSTEM AND METHOD FOR AUTOMATIC SELECTION OF TRANSMISSION LINE MACROMODELS

(75) Inventor: Ibrahim M. Elfadel, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 450 days.

This patent is subject to a terminal disclaimer.

(21) Appl. No.: 12/058,990

(22) Filed: Mar. 31, 2008

(65) Prior Publication Data

US 2008/0201125 A1 Aug. 21, 2008

Related U.S. Application Data

(63) Continuation of application No. 10/816,150, filed on Apr. 1, 2004, now Pat. No. 7,353,155.

(51) Int. Cl.
*G06F 17/50* (2006.01)
(52) U.S. Cl. .................... 703/2; 703/6; 703/13
(58) Field of Classification Search ............. 703/2, 13, 703/18, 19, 6; 716/6, 12
See application file for complete search history.

(56) References Cited

U.S. PATENT DOCUMENTS

| 5,946,482 A | 8/1999 | Barford et al. ......... 395/500.35 |
| 6,188,974 B1 | 2/2001 | Cullum et al. ................. 703/14 |
| 6,349,272 B1 | 2/2002 | Phillips ........................... 703/2 |
| 6,687,658 B1 | 2/2004 | Roychowdhury ............... 703/2 |
| 7,353,155 B2 * | 4/2008 | Elfadel ........................... 703/13 |
| 2003/0088394 A1 | 5/2003 | Min et al. ...................... 703/14 |

OTHER PUBLICATIONS

Branin, Proceedings Letters, 1967, pp. 2012-2013, vol. 55.
Dounavis, A., "Efficient Passive Circuit Models for Distributed Networks with Frequency-Dependent Parameters", IEEE Transactions on Advanced Packaging, Aug. 2000, pp. 382-392, vol. 23, No. 3.
Gruodis, A. J. et al., "Coupled Lossy Transmission Line Characterization and Simulation", IBM J. Res. Develop., Jan. 1981, pp. 25-41, vol. 25, No. 1.
Elfadel et al. A comparative Study of Two Transient Analysis Algorithms for Lossy Transmission Lines with Frequency Dependent Data. IEEE Transactions on Advanced Packaging, vol. 25, No. 2, May 2002.
Jaijeet Royschowdhury. "Automated Macromodel Generation for Electronic Systems". Aug. 2003.

* cited by examiner

*Primary Examiner* — Thai Phan
(74) *Attorney, Agent, or Firm* — Harrington & Smith

(57) ABSTRACT

Transmission line macromodels can be classified into main categories of delay-extraction and rational approximation. The exponential solution of the Telegrapher's Equation is used to create a system and method that enable a time-domain circuit simulator to automatically select the most appropriate macromodel for a given transmission line structure.

17 Claims, 4 Drawing Sheets

SYSTEM AND METHOD FOR AUTOMATIC SELECTION OF TRANSMISSION LINE MACROMODELS

This application is a continuation application of U.S. non-provisional patent application Ser. No. 10/816,150, filed on Apr. 1, 2004 now U.S. Pat. No. 7,353,155.

FIELD OF THE INVENTION

This invention relates to the design and analysis of interconnections between electrical systems. More specifically, the invention relates to the efficient modeling and simulation of multiconductor transmission lines by automatically selecting macromodels for any given transmission line structure.

BACKGROUND OF THE INVENTION

High-performance electrical system design requires the use of sophisticated interconnections between system components. These interconnections must be designed so as to achieve three interrelated objectives: minimize signaling delay between components; minimize electromagnetic cross talk noise between interconnections; and ensure immunity to external electromagnetic interferences. Two main examples of these interconnections are multiconductor transmission lines and connectors. The present invention is concerned mainly with multiconductor transmission lines.

Multiconductor transmission lines are present throughout any electrical system comprising several integrated circuits (chips). They are used on a printed circuit board (PCB) for signal transmission between different chipsets. Multiconductor transmission lines are also used to transfer signals inside a package containing the chip as well as to transfer signals inside the chip itself. PCB and package transmission lines are known in the art as off-chip transmission lines while the lines responsible for transferring signals within the chip are known in the art as on-chip transmission lines. The transmission line nature of an interconnection depends on the wavelength of the signal carried by the interconnection. With the constant increase in electronic system speed, the signal wavelengths are becoming shorter. The net result is that more and more of the interconnections are behaving as transmission lines, which makes the task of modeling and analyzing overwhelming. The situation is rendered even more complex by the fact that the on-chip and off-chip transmission lines behave very differently in terms of the losses (i.e., attenuation and the distortion) incurred by the signals they carry. Because of their small cross sections, on-chip transmission lines are very lossy relative to off-chip transmission lines. Among off-chip transmission lines, packaging transmission lines are in general more lossy than PCB transmission lines. These differences in location (on-chip, off-chip), length (short, long), losses (high, low), and signal wavelength make the efficient modeling, simulation, and analysis of transmission lines a difficult engineering task.

There are two main macromodeling approaches used to analyze the behavior of a transmission line. The first approach is based on a preliminary extraction of the pure delay (also called time-of-flight delay) incurred by the signal as it is transmitted. An instance of such approach is the method of characteristics (MoC) (Branin, IEEE Proc. Vol. 55, pp. 2012-2013, 1967) and its various generalizations (Gruodis and Chang, IBM J. of Res. Dev. Vol. 25, pp. 25-41, 1982). The second macromodeling approach represents the transmission line with a cascade of electrical cells, each cell comprising lumped circuit elements such as resistors, capacitors, and inductors. This approach is equivalent to approximating the transfer function of the transmission line, which is a transcendental function, with a rational (i.e., non transcendental) function (e.g. Dounavis et. al., IEEE Transaction on Advanced Packaging, Vol. 22, pp. 382-392, 2000). The first macromodeling approach is referred to as the delay extraction approach while the second macromodeling approach is referred to as the rational approximation approach.

It is well known in the art (e.g., Elfadel et. al., IEEE Transactions on Advanced Packaging, Vol. 25, pp. 143-153, 2002) that long, low-loss lines, such as coaxial cable (e.g., those connecting processing nodes in a supercomputer) are efficiently simulated using macromodels based on delay extraction approach. Short, high-loss transmission lines, such as on-chip bus lines (e.g., global bus connecting cable and CPU in a microprocessor) are efficiently simulated using macromodels based on rational approximation approach. Commercial circuit simulators, such as HSPICE, offer both types of modeling approaches to users. However, those simulators require the user to select which approach to use in a given situation. Users lacking expertise in transmission line theory may select the wrong or less efficient transmission line model (e.g., rational approximation model for a long, lossless line), thus incurring a significant cost in terms of transmission line simulation efficiency and accuracy. There is therefore a need to develop an automatic selection system and method for transmission line macromodels based solely on the physical and geometric characteristics of the transmission line. Such an automatic selection system can be part of a computer-aided-design (CAD) tool, such as a circuit simulator, that will handle all matters related to the efficient and accurate simulation of transmission lines throughout the electrical system. Such automatic selection will also be crucial for system-level simulation for high-performance electronic systems (e.g., mainframe computers) where the number of transmission lines is very large and it is not known a priori what type of macromodel is most appropriate for a given transmission line. The present invention satisfies these needs by providing a system and method for the automatic selection of transmission line macromodels.

SUMMARY OF THE INVENTION

The automatic selection is based on the transmission line length, the line per-unit-length parameters, and the maximum frequency of operation. In accordance with the teachings of the present invention, a method and system are provided which analyzes the exponential matrix solution of the Telegrapher's equation of a transmission line in order to select the better and more efficient macromodel to be used for simulating multiconductor transmission lines.

The analysis considers the lossy transmission line as a perturbation of the lossless transmission line, which behaves as an ideal delay for which a delay-based macromodel gives the exact answer very efficiently. Taylor series analysis is then used to derive a mathematical criterion from which one can decompose the behavior of the lossy line into a pure delay portion and a pure loss portion. This criteria is then used to derive a critical line length defining the boundary between the two macromodel efficiency regions: rational approximation macromodel for line lengths below the critical length and delay extraction macromodel for lines of length above the critical length.

An aspect of this invention is, therefore, the provision of an improved system and method for a computer electrical system design. Another aspect of the present invention is the provision of an improved system and method for computer interconnection system design. A further aspect of the present invention is the provision of an improved system and method for computer interconnection system design using macromodeling of multiconductor transmission lines. A still further aspect of the present invention is the provision of an improved system and method for computer interconnection system design using automatic macromodel selection of a multiconductor transmission line. A yet further aspect of the present invention is the provision of an improved system and method for automatic macromodel selection of a multiconductor transmission line that can incorporated in a computer-aided-design tool.

This invention provides a system, a method and a signal bearing medium that tangibly embodies a program of machine-readable instructions executable by a digital processing apparatus to perform operations to automatically select a macromodel from a set of macromodels for use in simulating a transmission line. The operations include providing input parameters of per-unit-length resistance (R), per-unit-length inductance (L), per-unit-length conductance (G), per-unit-length capacitance (C), length (d), and maximum operating frequency ($\omega_{max}$); computing total distortion ($\Delta_T$) from the input parameters; providing an error threshold (e); comparing the total distortion with the error threshold; and automatically selecting a macromodel based upon whether the total distortion is more or less than the error threshold.

This invention further provides a system, a method and a signal bearing medium that tangibly embodies a program of machine-readable instructions executable by a digital processing apparatus to perform operations to automatically select a macromodel from a set of macromodels for use in simulating a transmission line. The operations include providing input parameters of per-unit-length resistance (R), per-unit-length capacitance (C), length (d), and maximum operating frequency ($\omega_{max}$), and error threshold ($\epsilon$); computing a critical length ($d_{critical}$) from the input parameters; comparing the length of the transmission line with the critical length; and automatically selecting a macromodel based upon whether the length of the transmission line is less than or greater than the critical length.

DETAILED DESCRIPTION OF THE INVENTION

In order to better understand the significance of the present invention a brief discussion of the mathematical basis for the automatic selection of multiconductor transmission line macromodels will now be provided.

Figure 1:
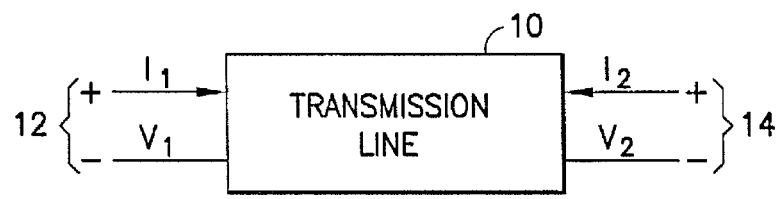
FIG. 1 is a schematic diagram of a transmission line represented as a two-port circuit.

Referring now to the figures and to FIG. 1 in particular, there is shown schematically a transmission line 10 as a two-port network with inputs $I_1$ and $V_1$ and outputs $I_2$ and $V_2$. The port currents $I_1(s)$ and $-I_2(s)$ are related to port voltages $V_1(s)$ and $V_2(s)$ by the frequency-domain exponential solution of the Telegrapher's Equation:

$$\begin{bmatrix} -I_2(s) \\ V_2(s) \end{bmatrix} = e^{-d[\Phi(s)]} \begin{bmatrix} I_1(s) \\ V_1(s) \end{bmatrix} \text{ with } \Phi(s) = \begin{bmatrix} 0 & G+sC \\ R+sL & 0 \end{bmatrix} \quad \text{(eq. 1)}$$

The length of the single transmission line is d, R is the per-unit-length resistance, L is the per-unit-length inductance, G is the per-unit-length conductance, and C is the per-unit-length capacitance of the transmission line.

The matrix $T(s) \equiv e^{-d[\Phi(s)]}$ is the transfer matrix from the near end (ports 1) 12 to the far end (ports 2) 14 of the transmission line 10. For a single transmission line T(s) is a 2×2 matrix. For a multiconductor transmission line with n lines, the per-unit-length parameters are n×n matrices and T(s) is a 2n×2n matrix.

When the line is lossless, R=G=0, and the delay per unit length is given by $\tau_0 = \sqrt{LC}$ and the total line delay is $\tau = d\tau_0$.

Assume the transfer matrix of a lossy transmission line can be decomposed as $$T(s) \equiv e^{-d[\Phi(s)]} = \exp\left(-d\begin{bmatrix} 0 & G+sC \\ R+sL & 0 \end{bmatrix}\right) \quad \text{(eq. 2)}$$

$$= \exp\left(-d\begin{bmatrix} 0 & G \\ R & 0 \end{bmatrix}\right) \exp\left(-d\begin{bmatrix} 0 & sC \\ sL & 0 \end{bmatrix}\right)$$

$$\equiv T_{delay}(s) T_{loss}(s).$$

Then one can use a pure delay line to model the delay transfer matrix $$T_{delay}(s) \equiv \exp\left(-d\begin{bmatrix} 0 & sC \\ sL & 0 \end{bmatrix}\right)$$

and a purely resistive network to model the loss transfer matrix $$T_{loss}(s) \equiv \exp\left(-d\begin{bmatrix} 0 & G \\ R & 0 \end{bmatrix}\right).$$

Unfortunately, the above decomposition is not always valid. This is because, unlike the scalar case where $e^{x+y}=e^x e^y$, in the matrix case $e^{A+B} \neq e^A e^B$ unless the square matrices A and B commute with each other, i.e., AB=BA. When two matrices do not commute the nonzero matrix [A, B]=AB−BA is called the commutator of A and B.

For the single conductor line case, denote $$A = \begin{bmatrix} 0 & G \\ R & 0 \end{bmatrix} \text{ and } B = \begin{bmatrix} 0 & C \\ L & 0 \end{bmatrix}.$$

Then, $$[A, B] = \begin{bmatrix} GL - CR & 0 \\ 0 & LG - RC \end{bmatrix}.$$

Note that the above commutator expression is valid for a multiconductor line case. The order of matrix products GL, LG, CR, and RC is important. For single conductor line, the commutator is 0 if and only if GL=CR which is the same as LG=RC. This is exactly Heaviside's distortionless line criteria, which proves the important result that the behavior of a distortionless transmission line can always be decomposed into that of a pure delay line and a purely resistive network.

When the line is not distortionless, then it is desirable to find a criterion where equation 2 is approximately satisfied. To derive this criterion, first expand T(s) in a Taylor series to the 2nd-order in the line length d, i.e., $$T(s) = \exp\left(-d\begin{bmatrix} 0 & G + sC \\ R + sL & 0 \end{bmatrix}\right) \quad \text{(eq. 3)}$$

$$= \exp(-d[A + sB])$$

$$\approx I - d(A + sB) + \frac{d^2(A + sB)^2}{2}$$

$$= I - d(A + sB) + \frac{d^2(A^2 + sAB + sBA + s^2B^2)}{2}$$

Similarly, $T_{loss}(s)$ and $T_{delay}(s)$ are expanded into 2nd-order Taylor series with $$T_{loss}(s) = \exp\left(-d\begin{bmatrix} 0 & G \\ R & 0 \end{bmatrix}\right) \quad \text{(eq. 4)}$$

$$= \exp(-dA)$$

$$\approx I - dA + \frac{d^2A^2}{2}$$

and $$T_{delay}(s) = \exp\left(-d\begin{bmatrix} 0 & sC \\ sL & 0 \end{bmatrix}\right) \quad \text{(eq. 5)}$$

$$= \exp(-dsB)$$

$$\approx I - dsB + \frac{d^2s^2B^2}{2}$$

Multiplying the expansions of $T_{loss}(s)$ and $T_{delay}(s)$ and dropping terms of order 3 or higher in d, results in $$T_{loss}(s)T_{delay}(s) \approx I - d(A + sB) + \frac{d^2(A^2 + 2sAB + s^2B^2)}{2} \quad \text{(eq. 6)}$$

Define the error matrix $$E(s) \equiv T_{loss}(s)T_{delay}(s) - T(s). \quad \text{(eq.7)}$$

Then, based on the Taylor series expansions of equation 3 and equation 6, the error matrix can be approximated as $$E(s) \approx \frac{sd^2[A, B]}{2}. \quad \text{(eq. 8)}$$

It follows that when T(s) is approximated with the product $T_{loss}(s)T_{delay}(s)$ the approximation error is proportional to the matrix commutator [A, B]. This is in line with the distortionless case where the zero commutator guarantees that the error is also zero. Another interesting observation is that the error is proportional to s=jω, where ω is the frequency of operation, and quadratic in the length of the line. In other words, line length has more impact on the approximation error than the frequency range of operation.

Let now ε>0 be a required upper bound on this approximation error. By taking the matrix norms of equation 8, using the ε upper bound, and replacing s with $j\omega_{max}$, where $\omega_{max}$ is the maximum operating frequency, the conclusion is that the inequality $$\left\|\frac{sd^2[A, B]}{2}\right\| = \omega_{max}d^2\|[A, B]\| < \varepsilon \quad \text{(eq. 9)}$$

must be satisfied in order to guarantee that the decomposition error is below the error threshold throughout the frequency range. Note that the commutator matrix norm is $$\|[A,B]\|=\max(\|GL-CR\|,\|LG-RC\|)$$

and that for the single line case, this norm reduces to $$\|[A,B]\|=|LG-RC|.$$

Another simplification is the case when the per-unit-length conductance is zero (e.g., on-chip transmission lines) in which case $\|[A, B]\|$=RC and the error criterion becomes $$\left\|\frac{sd^2[A, B]}{2}\right\| = \frac{\omega_{max}d^2RC}{2} < \varepsilon \quad \text{(eq. 10)}$$

Based on equation 10, define the critical line length as $$d_{critical}=\sqrt{2\varepsilon/(\omega_{max}RC)} \quad \text{(eq. 11)}$$

This is the length above which the approximation error becomes unacceptable. To recover the accuracy, the line must be segmented into segments of length less than the critical length. Some implementations of the method of characteristics require such segmentation especially for very lossy lines. This segmentation has a negative impact on the efficiency of the transmission line macromodel. An interesting observation consistent with past heuristic experience is that the critical length for the method of characteristic macromodel is inversely proportional to the resistive losses per unit length of the line. Furthermore, higher frequencies require smaller line segments.

An alternative interpretation of equation 10 is that delay extraction is needed only if the length of the line is above the critical length. For lines with $d<d_{critical}$ a rational approximation macromodel satisfies the required accuracy.

Having now set forth the basis for the selection of the transmission line length at which either one of the delay extraction macromodel or the rational approximation macromodel is the preferred macromodel for simulating transmission lines, preferred embodiments of a system and method for automatically making the selection of which of the macromodels to use for simulating a multiconductor transmission line will now be described.

Figure 2:
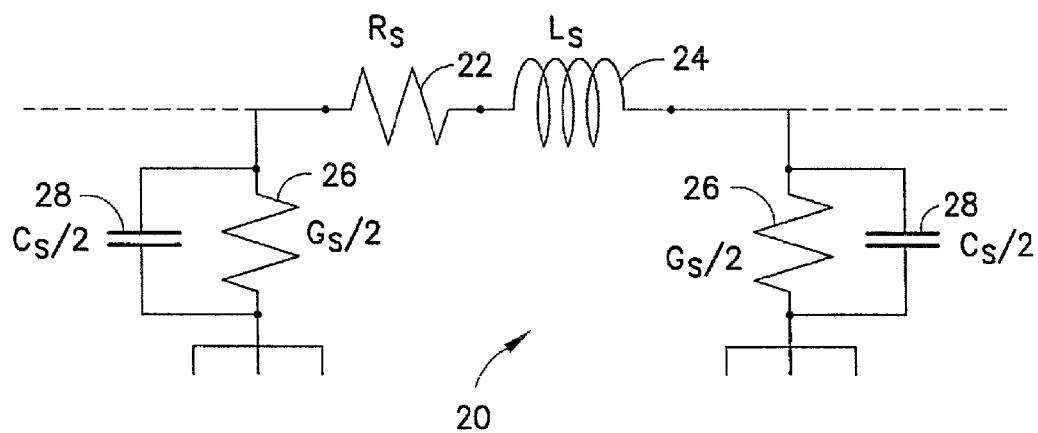
FIG. 2 is a schematic electrical circuit diagram representation of a typical cell of a rational approximation macromodel of a transmission line.

FIG. 2 is a schematic representation of a typical electrical cell 20 of a rational assumption macromodel of a transmission line. The full macromodel is a cascade of such cells. The cell circuit element values of Rs 22, Ls 24, Gs/2 26, and Cs/2 26 are derived from the transmission line length d, the number of cells and the per-unit-length R, L, G, and C values. The rational assumption macromodel of a transmission line is one preferred approach for simulating a transmission line.

Figure 3:
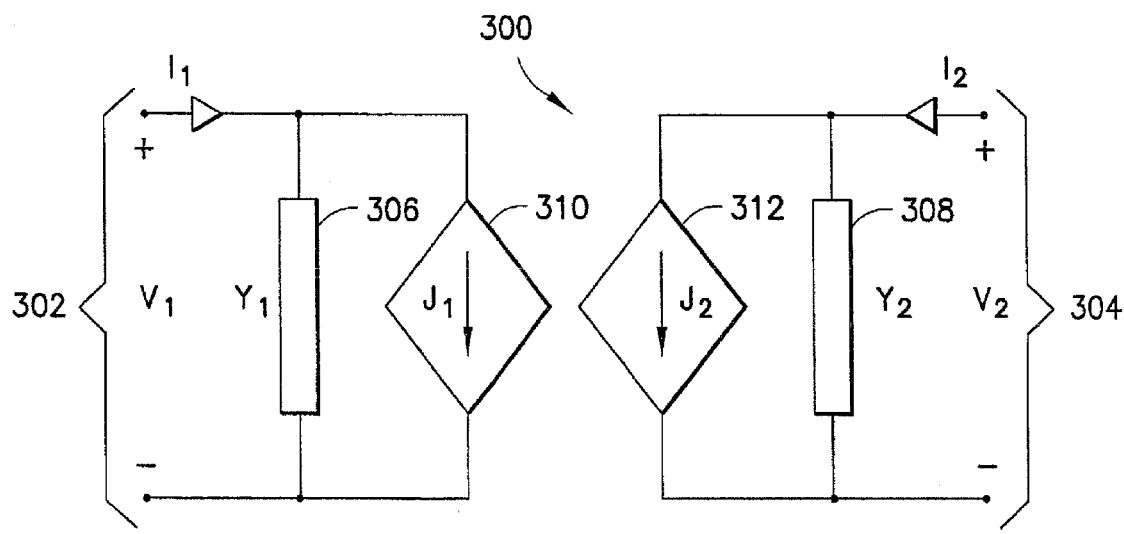
FIG. 3 is a schematic electrical circuit diagram representation of a typical cell of a delay extraction macromodel of a transmission line.

FIG. 3 is a schematic representation of a typical electrical circuit representation 300 of a delay extraction macromodel of a transmission line. This macromodel relates the voltage-current pair at the near end $(V_1, I_1)$ 302 of the circuit 300 to the voltage-current pair at the far end $(V_2, I_2)$ 304 of the circuit 300. The values $Y_1$ 306 and $Y_2$ 308 of the circuit 300 are admittance derived from the transmission line. The values $J_1$ 310 and $J_2$ 312 of the circuit 300 are controlled current sources. The extracted delay of the macromodel is implicit in the values $J_1$ and $J_2$. The delay extraction macromodel of a transmission line is another preferred approach for simulating a transmission line.

Figure 4:
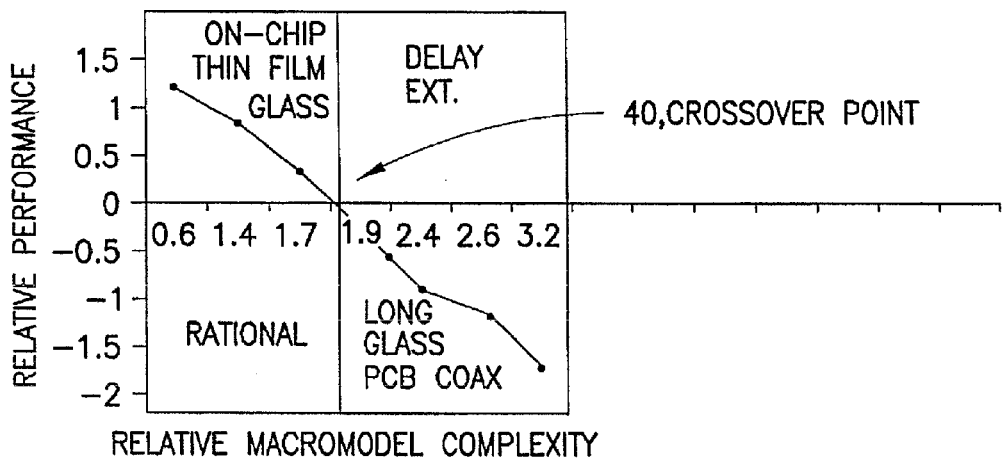
FIG. 4 is a graphical representation summarizing the CPU efficiency of the rational approximation macromodel and delay extraction macromodel of a transmission line.

FIG. 4 is a graphical representation summarizing the CPU efficiency of two preferred categories of transmission line macromodels, i.e. delay extraction macromodel and rational assumption macromodel. The delay extraction macromodel is more efficient for simulating long, low-loss transmission lines. The rational assumption macromodel is more efficient for simulating short, high-loss transmission lines. The crossover point 40 is not known a priori.

The problem encountered with using macromodels to simulate transmission lines occurs when a user is required to select the more efficient macromodel to be used for simulating transmission lines. The present invention provides a system and method for the automatic selection of the more efficient macromodel for a particular transmission line structure.

Figure 5:
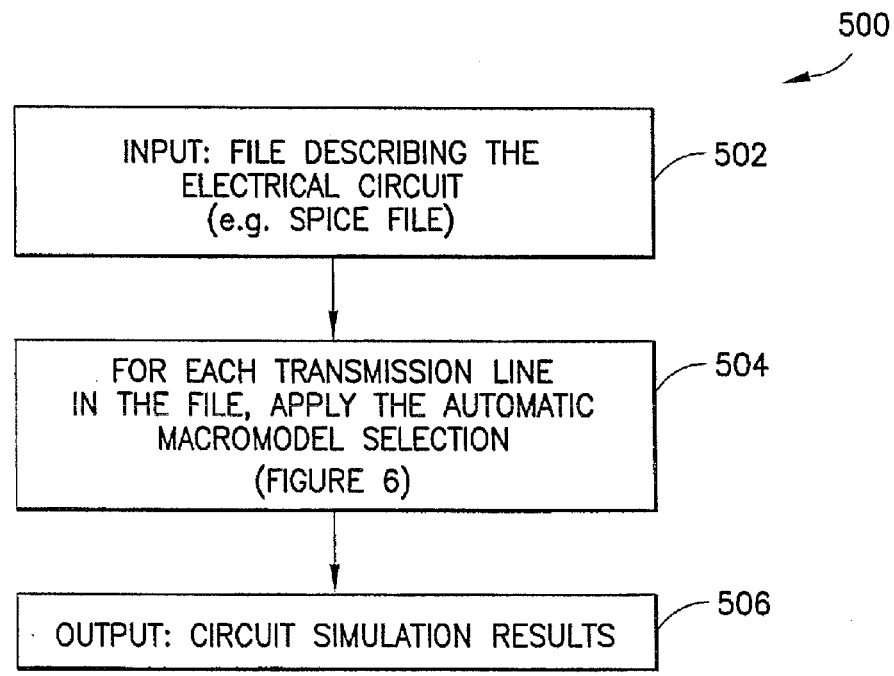
FIG. 5 is a flow chart of the overall CAD process for simulation of an electrical system with several multiconductor transmission lines.

The flow chart in FIG. 5 shows an overall CAD process 500 for simulation of an electrical system having several multiconductor transmission lines. First, an input 502 describing the electrical circuit to be simulated (e.g., SPICE file) is provided as an input to the CAD system. The CAD system may be any conventional CAD system known in the art. Then, for each transmission line in the inputted file, an automatic macromodel selection is performed 504 in accordance with the process described in conjunction with FIG. 6 below. After applying the automatically selected macromodel, an output 506 is provided which is the circuit simulation result using the cells in either FIG. 2 or 3 corresponding to the selected macromodel.

Figure 6:
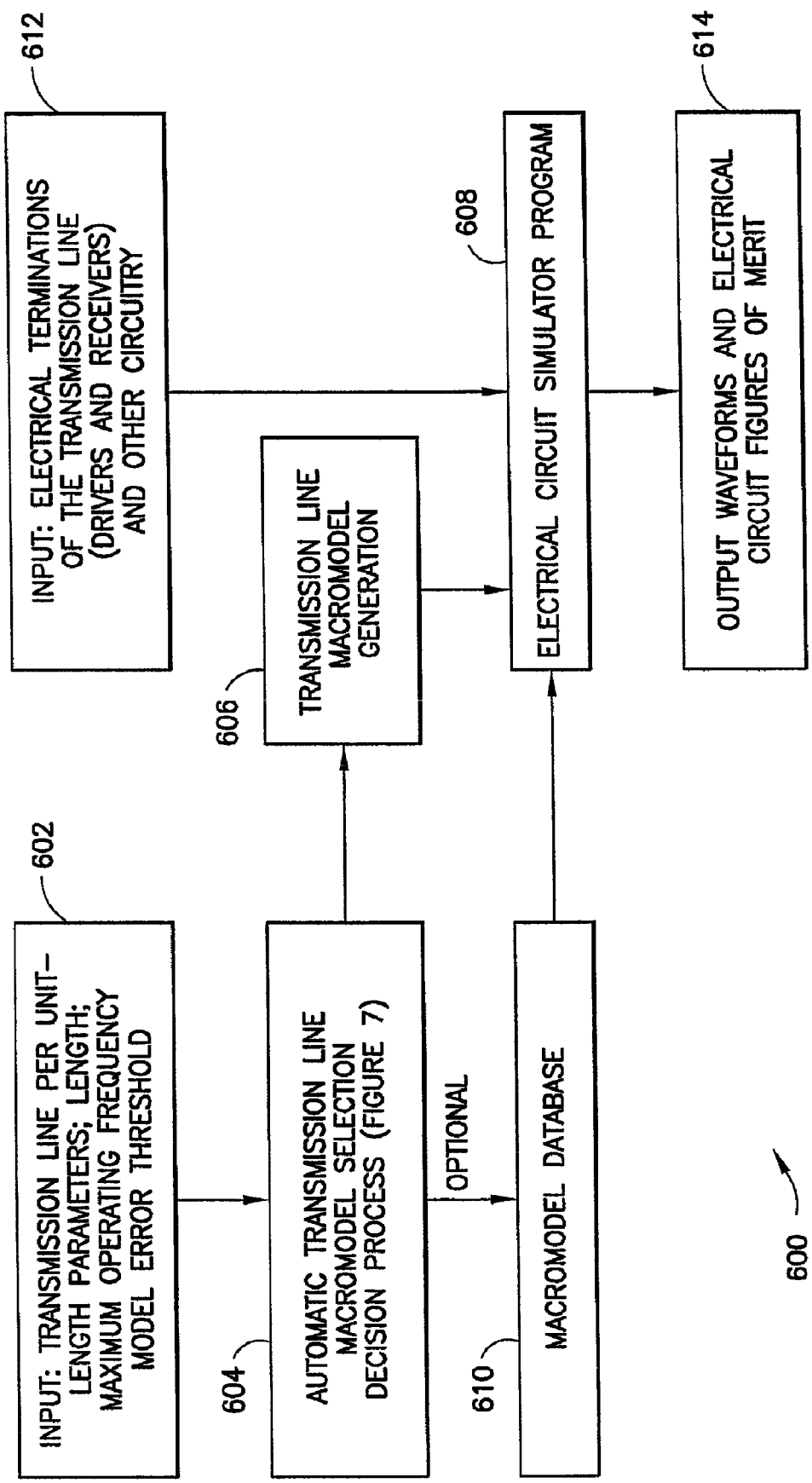
FIG. 6 is a block diagram of a preferred embodiment of an automatic macromodel selection process incorporating the present invention used in the CAD system in FIG. 5.

A preferred embodiment of an automatic macromodel selection process 600 used in step 504 of FIG. 5 is shown in the block diagram of FIG. 6.

Transmission line parameters, including the per-unit-length R, L, G, and C values, the transmission line length d, the maximum operating frequency $\omega_{max}$ and the model error threshold $\epsilon$ are provided as inputs 602 to an automatic transmission line macromodel selection system 604. Using the inputted parameters, an automatic transmission line macromodel selection decision process 604, in accordance with the flow chart shown in FIG. 7 and described below, is performed.

After making the macromodel selection decision, a transmission line macromodel is generated 606 and provided to an electrical circuit simulator program 608. Optionally, macromodel information from macromodel database 610 is provided to the electrical circuit simulator program 608 in accordance with the selected macromodel. Electrical terminations of the transmission line (drivers and receivers) at the near and far ends of the transmission line and other circuitry information (e.g., reference nodes for the near and far ends) 612 are also provided as input to the electrical circuit simulator program 608. The electrical circuit simulator program 608 provides output waveforms and electrical circuit figures of merit related to the transmission line to be simulated 614. The output waveforms and electrical circuit figures of merit are used to provide the circuit simulation results in step 506.

Figure 7:
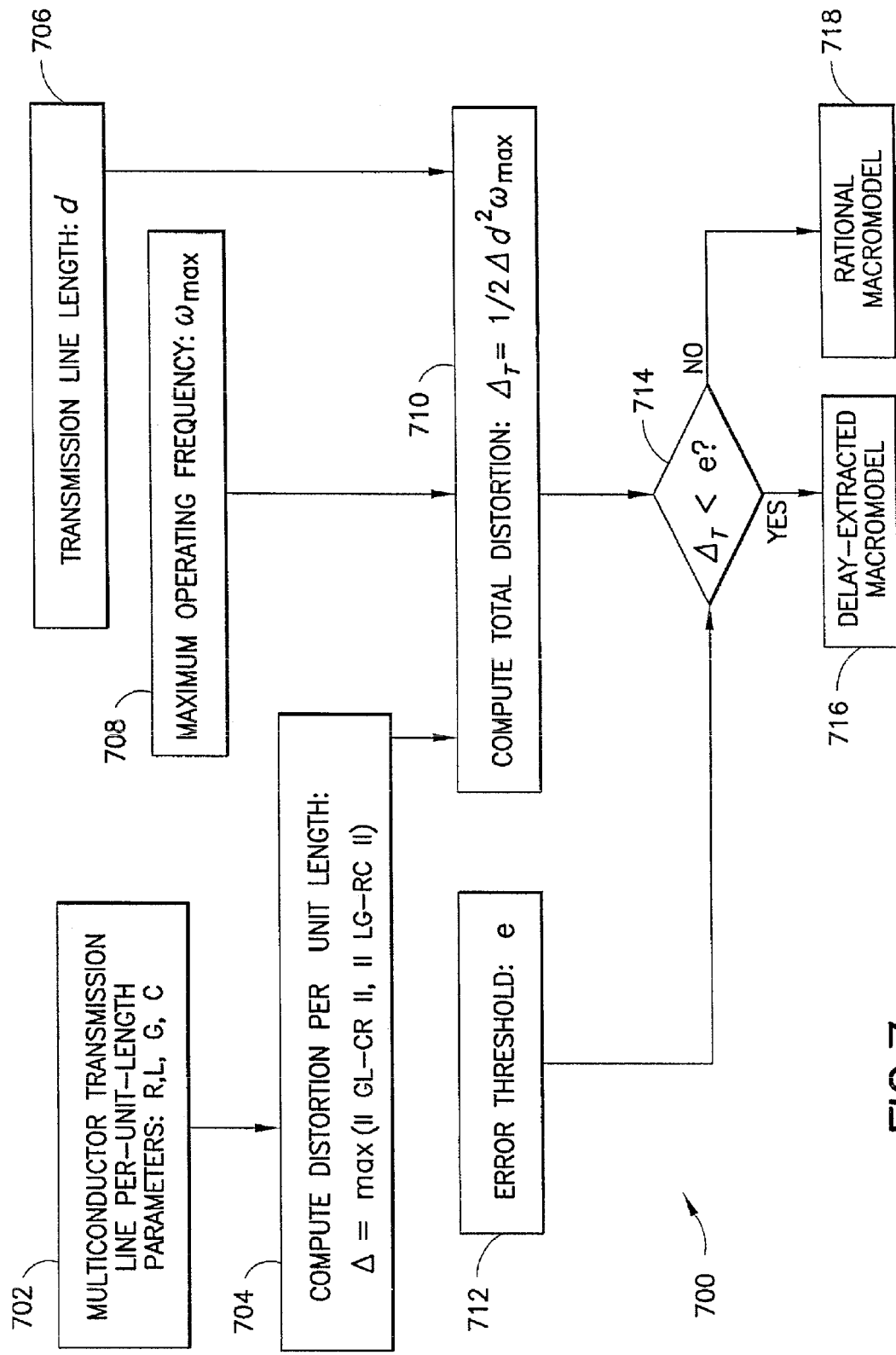
FIG. 7 is a flow chart of an automatic transmission line macromodel selection process comprising the present invention.

FIG. 7 is a flow chart of an automatic transmission line macromodel selection decision process 700, the result of which is used in block 604 of FIG. 6 for selecting the more efficient macromodel to be used to simulate the transmission line.

The multiconductor transmission line per-unit-length R, L, G, and C parameter values 702 are provided as inputs to be used to compute 704 the transmission line distortion per-unit-length: $\Delta=\max(\|GL-CR\|, \|LG-RC\|)$.

The computed distortion per-unit-length $\Delta$ from step 704, the transmission line length d from block 706, and the maximum operating frequency $\omega_{max}$ from block 708 are provided as inputs to compute the total distortion 710

$$\Delta_T = \frac{\Delta d^2 \omega_{max}}{2}.$$

The computed total distortion $\Delta T$ from block 710 and an error threshold e from block 712 are compared at step 714. If $\Delta_T<e$, the delay extraction macromodel is selected 716 and used in step 604 in FIG. 6. If $\Delta_T>e$, then the rational assumption macromodel is selected 718 and used in step 604 in FIG. 6.

While the delay-extraction macromodel and the rational approximation macromodel are preferred simulation models, it will be apparent to those skilled in the art that other macromodels may be included for selection according to appropriate criteria.

The automatic selection of efficient transmission line macromodels in accordance with the teachings of the present invention may be performed on a general purpose computer. Preferably, the automatic selection process is used in conjunction with a CAD system or CAD program. The automatic selection process obviates the requirement of a user to select the most efficient transmission line macromodel for a particular multiconductor transmission line to be simulated.

While there has been described and illustrated a preferred embodiment of a system and method for the automatic selection of transmission line macromodels, it will be apparent to those skilled in the art that modifications and variations are possible without deviating from the broad teachings and spirit of the present invention which shall be limited solely by the scope of the claims appended hereto.

What is claimed is:

1. A computer modeling system comprising:
a processor that has at least one input that receives parameters related to one or more electrical transmission lines, the parameters representing one or more physical characteristics and one or more electrical characteristics of the one or more electrical transmission lines;
a database with a set of one or more macromodels that in which the processor is arranged to apply the parameters in a simulation to determine an electrical behavior of one or more of the electrical transmission lines; and
an automatic selection process controlled by the processor that selects a macromodel from the set of macromodels to simulate one or more of the electrical transmission lines, the selection of the macromodel being determined by comparing a total distortion to an error threshold, wherein the processor provides a generated transmission line macromodel corresponding to the selected macromodel to an electrical circuit simulator program, wherein the processor uses a matrix norm of some of the parameters in determining the total distortion.

2. A computer modeling system as in claim 1, wherein the processor also uses an operational frequency and a transmission line length to determine the total distortion.

3. A computer modeling system as in claim 1, further comprising the electrical circuit simulator program and providing electrical terminations of the one or more transmission lines as an input to the electrical circuit simulator program.

4. A computer modeling system comprising:
a processor that has at least one input that receives parameters related to one or more electrical transmission lines, the parameters representing one or more physical characteristics and one or more electrical characteristics of the one or more electrical transmission lines;
a database with a set of one or more macromodels that in which the processor is arranged to apply the parameters in a simulation to determine an electrical behavior of one or more of the electrical transmission lines; and
an automatic selection process controlled by the processor that selects a macromodel from the set of macromodels to simulate one or more of the electrical transmission lines, the selection of the macromodel being determined by comparing a length of the transmission line to a critical length calculated from the parameters, wherein if the length of the transmission line is greater than the critical length calculated from the parameters, selecting a first macromodel, otherwise, selecting a second macromodel from the set of the one or more macromodels, wherein the processor provides a generated transmission line macromodel corresponding to the selected macromodel to an electrical circuit simulator program.

5. A computer modeling system as in claim 4, wherein the parameters include an operational frequency.

6. A computer modeling system as in claim 4, further comprising the electrical circuit simulator program.

7. A computer modeling system as in claim 4, wherein the at least one input is provided in a file.

8. A non-transitory computer readable medium embodied with a computer program of machine-readable instructions executable by a digital processing apparatus to perform operations to automatically select a macromodel from a set of macromodels for use in simulating a transmission line, the operations comprising:
providing input parameters of physical dimensions, electrical characteristics, and maximum operating frequency ($\omega_{max}$);
computing total distortion ($\Delta_T$) from the input parameters using a matrix norm of some of the parameters in determining the total distortion;
providing an error threshold (e);
comparing the total distortion with the error threshold;
automatically selecting a macromodel based upon whether the total distortion is more or less than the error threshold.

9. A non-transitory computer readable medium as set forth in claim 8, wherein the macromodel is selected from one of a delay extraction macromodel and a rational approximation macromodel.

10. A non-transitory computer readable medium according to claim 8, used in a computer-aided-design (CAD) system.

11. A non-transitory computer readable medium as set forth in claim 8, the operations further comprising:
inputting the selected macromodel into an electrical simulator program;
inputting electrical terminations information into the electrical simulator program;
inputting a macromodel database into the electrical simulator program; and
outputting waveforms and/or electrical circuit figures of merit from the electrical simulator program.

12. A non-transitory computer readable medium embodied with a computer program of machine-readable instructions executable by a digital processing apparatus to perform operations to automatically select a macromodel from a set of macromodels for use in simulating a transmission line, the operations comprising:
providing input parameters of physical dimensions, electrical characteristics, maximum operating frequency ($\omega_{max}$), and error threshold ($\epsilon$);
computing a critical length ($d_{critical}$) from the input parameters;
comparing the length of the transmission line with the critical length;
automatically selecting a first macromodel if the length of the transmission line is greater than the critical length calculated from the parameters, otherwise, automatically selecting a second macromodel.

13. A non-transitory computer readable medium as set forth in claim 12, wherein one of the first and second macromodels is selected from one of a delay extraction macromodel and a rational approximation macromodel.

14. A non-transitory computer readable medium according to claim 12 used in a computer-aided-design (CAD) system.

15. A non-transitory computer readable medium as set forth in claim 12, wherein the electrical characteristics are input in a file.

16. A non-transitory computer readable medium as set forth in claim 12, further comprising providing an output from the selected macromodel as an input to an electrical circuit simulator program.

17. A non-transitory computer readable medium as set forth in claim 12, the operations further comprising:
inputting the selected macromodel into an electrical simulator program;
inputting electrical terminations information into the electrical simulator program;
inputting a macromodel database into the electrical simulator program; and
outputting waveforms and/or electrical circuit figures of merit from the electrical simulator program.

* * * * *